United States Patent
Davis et al.

(10) Patent No.: US 6,331,921 B1
(45) Date of Patent: Dec. 18, 2001

(54) MAGNETO-RESISTIVE HEAD READ AMPLIFIER

(75) Inventors: Bradley K. Davis; Robert M. Thelen, both of Ft. Collins, CO (US); Michael C. Allyn, Boise, ID (US)

(73) Assignee: Agilent Technologies, Inc, Palo Alto, CA (US)

( * ) Notice: Subject to any disclaimer, the term of this patent is extended or adjusted under 35 U.S.C. 154(b) by 0 days.

(21) Appl. No.: 09/110,219

(22) Filed: Jul. 6, 1998

(51) Int. Cl.[7] ............... G11B 5/02; G11B 5/09; G11B 5/03
(52) U.S. Cl. ............... 360/67; 360/46; 360/66
(58) Field of Search ............... 360/66–68, 46, 360/53; 330/258, 260, 261, 60, 63

(56) References Cited

U.S. PATENT DOCUMENTS

| | | | |
|---|---|---|---|
| 5,291,347 | 3/1994 | Ngo et al. | 360/68 |
| 5,426,542 | * 6/1995 | Smith | 360/67 |
| 5,619,386 | * 4/1997 | Voorman et al. | 360/66 |
| 5,661,614 | 8/1997 | Wallash et al. | 360/66 |
| 5,757,566 | * 5/1998 | Ngo et al. | 360/67 |
| 5,856,891 | * 1/1999 | Ngo | 360/66 |
| 5,877,911 | * 3/1999 | Klaassen et al. | 360/67 |

FOREIGN PATENT DOCUMENTS

| | | | |
|---|---|---|---|
| 0 348 027 A2 | 4/1989 | (EP) | G11B/5/00 |
| 0 803 862 A2 | 4/1997 | (EP) | G11B/5/02 |
| WO 98/18128 | 4/1998 | (WO) | G11B/27/36 |

OTHER PUBLICATIONS

Levashov, "Electric signal processing current supply—has inductance coil connected between resistor lead and gate of field effect transistor", Dec. 1985, Derwent Information Ltd, pp. 1–2.*

* cited by examiner

Primary Examiner—Regina Y. Neal

(57) ABSTRACT

In accordance with the present invention, a magneto-resistive head read amplifier circuit is provided which can be incorporated into a magnetic reader for reading information stored in magnetic form on a storage medium. The magneto-resistive head read amplifier of the present invention incorporates an inductor in the bottom current drain of the head read amplifier circuit which reduces or eliminates noise generated by the bottom current source transistor of the head read amplifier circuit. In accordance with a first embodiment of the present invention, the magneto-resistive head read amplifier is a single-polarity head read amplifier circuit which utilizes a bias current having a particular polarity. In accordance with a second embodiment of the present invention, the magneto-resistive head read amplifier is a dual-polarity head read amplifier circuit capable of operating with bias currents of opposite polarity. Both embodiments of the present invention preferably utilize a common mode feedback circuit and a differential feedback circuit which set the operating point of the head read amplifier circuits. The differential feedback circuit nulls the differential output voltage of the head read amplifier circuit and the common mode feedback circuit sets the minimum bias current for the magneto resistor. In the dual-polarity head read amplifier circuit, switching logic is utilized to enable the polarity of the bias current to selected.

22 Claims, 2 Drawing Sheets

MAGNETO-RESISTIVE HEAD READ AMPLIFIER

TECHNICAL FIELD OF THE INVENTION

The present invention relates to a magneto-resistive head read amplifier and, more particularly, to a magneto-resistive head read amplifier that can be incorporated into a magnetic reader for reading information stored in magnetic form on a storage medium.

BACKGROUND OF THE INVENTION

Magnetic readers are used in disc and tape drives for reading changes in the magnetic field of charges stored on a magnetic storage medium, such as a magnetic disk or tape. The read head comprised by the magnetic reader can be one of several types. Currently, three basic types of read heads are in common use, namely, composite heads, which are comprised of a ferrite core with a wire coil and a glass-filled gap, metal-in-gap (MIG) heads, which comprise a ferrite head in which metal alloys are sputtered into the magnetic gap of the head, thin-film heads, which comprise coil windings deposited on a ceramic base using semiconductor fabrication techniques, and magneto-resistive (MR) heads, which comprises a nickel-iron magneto-resistor sensing element which is fabricated using semiconductor fabrication techniques.

Composite heads, MIG heads and thin-film heads all utilize inductive elements that sense the rate of change of the magnetic field on the surface of the storage medium as the head passes over the surface of the storage medium. The change in magnetic flux energizes the inductive element, which results in the inductive element producing an analog output voltage signal. This output voltage signal, commonly referred to as the read-back signal, is typically filtered, amplified and converted into a digital representation of the information stored on the storage medium.

MR heads operate differently from these other types of common heads. MR heads operate in accordance with a phenomenon known as the magneto-resistive effect. Generally, this effect is characterized by a change in resistance of the magneto-resistor when the magneto resistor senses a change in the magnetic flux on the surface of the storage medium. The resistance of the magneto resistor depends on the angle of the current running through the magneto resistor as well as the direction of the magnetization of the magneto resistor. A constant sense current is passed through the magneto-resistor. As the MR head passes over an area on the surface of the storage medium having a change in magnetic flux, the resistance of the magneto resistor changes, resulting in a change in the amperage of the sense current. The voltage across the magneto resistor is kept constant Alternatively, a constant dc current may be passed through the magneto resistor and a change in voltage will occur when the resistance of the magneto resistor changes.

One advantage of the MR head over these other types of heads is that the MR head directly senses magnetic flux, whereas the other types of heads are energized by the flux. Therefore, greater flux is needed to energize the inductive elements to a level sufficient to produce an analog voltage output signal that is great enough to result in an accurate reading of the information contained on the storage medium. Therefore, the magnetic domains of the areas on the storage medium being sensed must be relatively large. The MR head, on the other hand, is capable of sensing smaller magnetic domains, which facilitates the use of smaller bit cells and narrower track widths, thus increasing the storage capacities of the storage mediums.

Another advantage of MR heads over heads that utilize inductive elements is that MR heads can be used more effectively than heads that utilize inductive elements with low-velocity magnetic tape and disk drives. Since the inductive elements detect rates of change of the magnetic flux, the velocity of the storage medium will affect the read-back signal. For disc drives with lower velocities, the read-back signal will not be as strong as it normally is with high-velocity drives and, therefore, more filtering and amplification of the read-back signal may be required. The weaker read-back signal may also result in a relatively low signal-to-noise (SNR) ratio. In contrast, since the magneto resistor senses magnetic flux directly, MR heads are relatively insensitive to the velocity of the storage medium. Therefore, they can be used with lower-velocity disk and tape drives while having relatively high signal-to-noise ratios.

The resistance of the magneto resistor is related to the angle between the direction of the current flowing through the magneto resistor and the direction of magnetization of the magneto resistor. The relationship between the resistance of the magneto resistor and this angle is characterized by a cosine squared curve. The cosine squared curve that defines this relationship is relatively linear when the angle is 45°. Therefore, in order to maximize SNR, it is desirable to cause the magneto resistor to operate in this linear range. Various schemes have been developed to bias the direction of magnetization away from the direction of the current flow in order to cause the magneto resistor to operate in this linear range. However, biasing the magnetization results in many other problems that must be dealt with, such as, for example, the formation of magnetic domains in the magneto resistor which obfuscate the angle of magnification of the magneto resistor.

The cosine squared curve is also relatively linear when the polarity of the current is reversed such that the direction of the current is away from the direction of magnetization, while still at an angle of 45° with respect to the magnetization vector. An MR read head normally works better (i.e., SNR is more satisfactory) when biased in one of these directions than it does when it is biased in the opposite direction. Typically, an MR read head is designed to operate in the linear range of the cosine squared curve with the bias current directed in the direction that is expected to maximize performance of the read head. The MR head read amplifier is then designed to bias the MR element in the chosen direction.

It would be beneficial to provide a head read amplifier that is capable of reversing the polarity of the bias current in order to bias the MR element in either of these two directions. One of the advantages of designing the head read amplifier in this manner is that the read head could be tested to determine which polarity maximizes performance and then the polarity that resulted in the best performance could be used to bias the MR element. Such a feature could result in increased head yield by making an otherwise unusable read head satisfactory. This is particularly important with respect to a multi-head drive in which as many as ten read heads may be connected on the same substrate. In this case, if any one of the read heads is faulty, the entire multi-head assembly must be replaced.

Another advantage of designing the head read amplifier to bias the MR element in either direction is that the head read amplifier could be used with read heads that need to be biased in different directions. Thus, the head read amplifier could be used with read heads purchased from different sources that have opposite biasing requirements.

However, providing a head read amplifier which is capable of switching the polarity of the bias current creates noise problems in the head read amplifier that must be overcome. Accordingly, a need exists for a method and apparatus for switching the polarity of the bias current in an MR head read amplifier which allow the polarity of the bias current to be switched without degrading the performance of the head read amplifier.

SUMMARY OF THE INVENTION

In accordance with the present invention, a magneto-resistive head read amplifier is provided which can be incorporated into a magnetic reader for reading information stored in magnetic form on a storage medium. The magneto-resistive head read amplifier of the present invention incorporates an inductor in the bottom current drain of the head read amplifier circuit which reduces or eliminates noise generated by the bottom current source transistor of the head read amplifier. In accordance with a first embodiment of the present invention, the magneto-resistive head read amplifier is a single-polarity head read amplifier which utilizes a bias current having a particular polarity. In accordance with a second embodiment of the present invention, the magneto-resistive head read amplifier is a dual-polarity head read amplifier capable of opening with bias currents of opposite polarity.

In accordance with the first embodiment of the present invention, the magneto-resistive head read amplifier comprises a magneto resistor which senses changes in magnetic flux on a surface of a magnetic storage medium, a bias-current source for generating a bias current for the magneto resistor, a differential feedback circuit coupled to output terminals of the head read amplifier circuit for nulling the differential output voltage produced at the output terminals, a common mode feedback circuit coupled to the output terminals of the head read amplifier circuit for setting a minimum bias current for the magneto resistor, and a current drain comprising the current-source transistor and an inductor, which is coupled to ground. The impedance of the inductor reduces, or rolls off, any noise generated by the current-source transistor.

Preferably, the bias-current source is a current-digital-to-analog converter and the value of the bias current can be adjusted by adjusting the current-analog-to-digital converter. The common mode feedback circuit preferably comprises a first cascode circuit and a second cascode circuit, each of which comprises a plurality of transistors connected in series. The first cascode circuit has a first terminal coupled to the first output terminal of the head read amplifier and a second terminal coupled to a first terminal of the magneto resistor. The second cascode circuit has a first terminal coupled to the second output terminal of the head read amplifier circuit and a second terminal coupled to a second terminal of the magneto resistor. A common mode amplifier has one of its input terminals coupled to a common mode reference voltage and the other input terminal coupled via a sensing resistor between the output terminals of the head read amplifier. The output of the common mode amplifier is coupled to the gate of the current-source transistor for tuning on the current source transistor.

The differential feedback circuit comprises a gain stage that amplifies the differential output voltage, a voltage-to-current converter stage that converts the amplified differential output voltage into a current signal, and a capacitor that integrates the current signal. The capacitor is coupled to the first cascode circuit for turning on the first cascode circuit. The second cascode circuit is coupled to a fixed reference voltage which turns on the second cascode circuit.

The dual-polarity head read amplifier of the present invention comprises a first bias-current source for generating a first bias current for the magneto resistor, and a second bias-current source for generating a second bias current for the magneto resistor, wherein the first and second bias currents have opposite polarities. The first bias-current source has an output terminal coupled to the first terminal of the magneto resistor via switching logic for passing the first bias current through the magneto resistor when said switching logic is in a first state. Similarly, the second bias-current source has an output terminal coupled to the second terminal of the magneto resistor via the switching logic for passing the second bias current through the magneto resistor when the switching logic is in a second state.

The dual-polarity head read amplifier preferably comprises a first transistor circuit and a second transistor circuit. The first transistor circuit has a first terminal coupled to the first output terminal of the head read amplifier circuit, a second terminal coupled to the first terminal of the magneto resistor, and a third terminal coupled to the switching logic. The second transistor circuit has a first terminal coupled to a second output terminal of the head read amplifier circuit, a second terminal coupled to the second terminal of the magneto resistor, and a third terminal coupled to the switching logic. When the switching logic is in the first state, the third terminal of the first transistor circuit is coupled to and biased by a fixed reference voltage source and the third terminal of the second transistor circuit is coupled to and biased by an output of a differential error amplifier. When the switching logic is in the second state, the third terminal of the second transistor circuit is coupled to and biased by the fixed reference voltage source and the third terminal of the first transistor circuit is coupled to and biased by the output of the differential error amplifier.

Preferably, the dual-polarity head read amplifier comprises a differential feedback circuit coupled to the first and second output terminals of the head read amplifier circuit. The differential feedback circuit receives a differential output voltage generated at the output terminals of the head read amplifier circuit and nulls the differential output voltage. The differential error amplifier is comprised by the differential feedback circuit. The differential feedback circuit is coupled to the switching logic via the differential error amplifier. A first common mode feedback circuit coupled to the output terminals of the head read amplifier circuit sets a minimum value for the first bias current. The first common mode feedback circuit is coupled to the first terminal of the magneto resistor via a first current-source transistor. A second common mode feedback circuit coupled to the output terminals of the head read amplifier circuit sets a minimum value for the second bias current. The second common mode feedback circuit is coupled to the second terminal of the magneto resistor via a second current-source transistor.

A current drain of the dual-polarity head read amplifier comprises the first and second current-source transistors and an inductor. The first current-source transistor has a first terminal coupled to the first common mode feedback circuit via the switching logic, a second terminal coupled to the first terminal of the magneto resistor and a third terminal coupled to a first terminal of the inductor. The second current-source transistor has a first terminal coupled to the second common mode feedback circuit via the switching logic, a second terminal coupled to the second terminal of the magneto resistor and a third terminal coupled to a first terminal of the inductor. The inductor has a second terminal coupled to ground. The impedance of the inductor reduces any noise generated by the first and second current-source transistor.

Preferably, the first and second bias-current sources are current-digital-to-analog converters and the values of the first and second bias currents can be adjusted by adjusting the current-analog-to-digital converters. Preferably, the first transistor circuit is a first cascode circuit and the second transistor circuit is a second cascode circuit. Each of the cascode circuits comprises a plurality of transistors connected in series. The first cascode circuit has a first terminal coupled to the first output terminal of the head read amplifier circuit and a second terminal coupled to the first terminal of the magneto resistor. The second cascode circuit has a first terminal coupled to the second output terminal of the head read amplifier circuit and a second terminal coupled to the second terminal of the magneto resistor. The first cascode circuit preferably is cross-coupled to the second cascode circuit via a pair of capacitors.

The first common mode feedback circuit comprises a first common mode amplifier that has a first terminal coupled between the output terminals of the head read amplifier circuit via a sensing resistor and a second terminal coupled to a common mode reference voltage. The first common mode amplifier has an output terminal coupled to the gate of the first current-source transistor via the switching logic. When the switching logic is in the first state, the switching logic connects the output of the first common mode amplifier to the gate of the first current-source transistor to turn on the first current-source transistor. The second common mode feedback circuit comprises a second common mode amplifier that has a first terminal coupled between the output terminals of the head read amplifier circuit via the sensing resistor and a second terminal coupled to the common mode reference voltage. The second common mode amplifier has an output terminal coupled to the gate of the second current-source transistor via the switching logic. When the switching logic is in the second state, the switching logic connects the output of the second common mode amplifier to the gate of the second current-source transistor to turn on the second current-source transistor.

Therefore, the switching logic controls the biasing of the cascode circuits and of the current-source transistors to enable the polarity of the bias current of the magneto resistor to be switched to obtain the best polarity for the bias current while the current-digital-to-analog converters enable the magnitude of the bias current to be optimized.

Other features and advantages of the present invention will become apparent from the following discussion, drawings and claims.

DETAILED DESCRIPTION OF THE INVENTION

Figure 1:
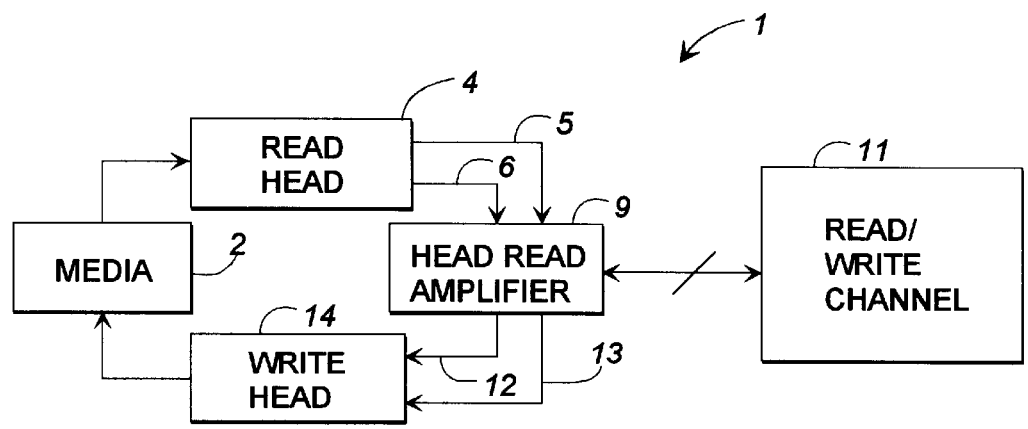
FIG. 1 is a block diagram illustrating a typical magnetic read/write system for reading information from and writing information to a magnetic storage media, such as, for example, a magnetic disk or tape.

FIG. 1 is a block diagram illustrating a typical magnetic read/write system 1 for reading information from and writing information to a magnetic storage media 2, such as, for example, a magnetic disk or tape. The present invention relates to such a system with the exception that the system of the present invention comprises the head read amplifier of the present invention, which is discussed in detail below with respect to the embodiments of FIGS. 3 and 4.

A typical magnetic read/write system 1 comprises an MR read head 4 for reading magnetic information stored on a magnetic storage media 2. The MR read head 4 comprises an MR element (not shown) which generates a bias current which is output on leads 5 and 6 to head read amplifier 9. The head read amplifier 9 amplifies the read signal output on leads 5 and 6 and processes the signal into information that is suitable for transmission over the read/write channel 11. The read/write channel 11 then transmits this information to processing circuitry (not shown), which may include, for example, an analog-to-digital converter and a microprocessor.

When information is being written to the storage media 2, information to be written is received by the head read eamplifier 9 from the read/write channel 11. The same circuitry that comprises the head read amplifier 9 also comprises a write driver circuit (not shown), which receives the information to be written, which is in the form of encoded data and causes the head read amplifier 9 to generate a current which excites an inductive element (not shown) comprised in the write head 14. The inductive element of the write head 14 creates magnetic fields which change the magnetization of the magnetic storage media 2.

Figure 2:
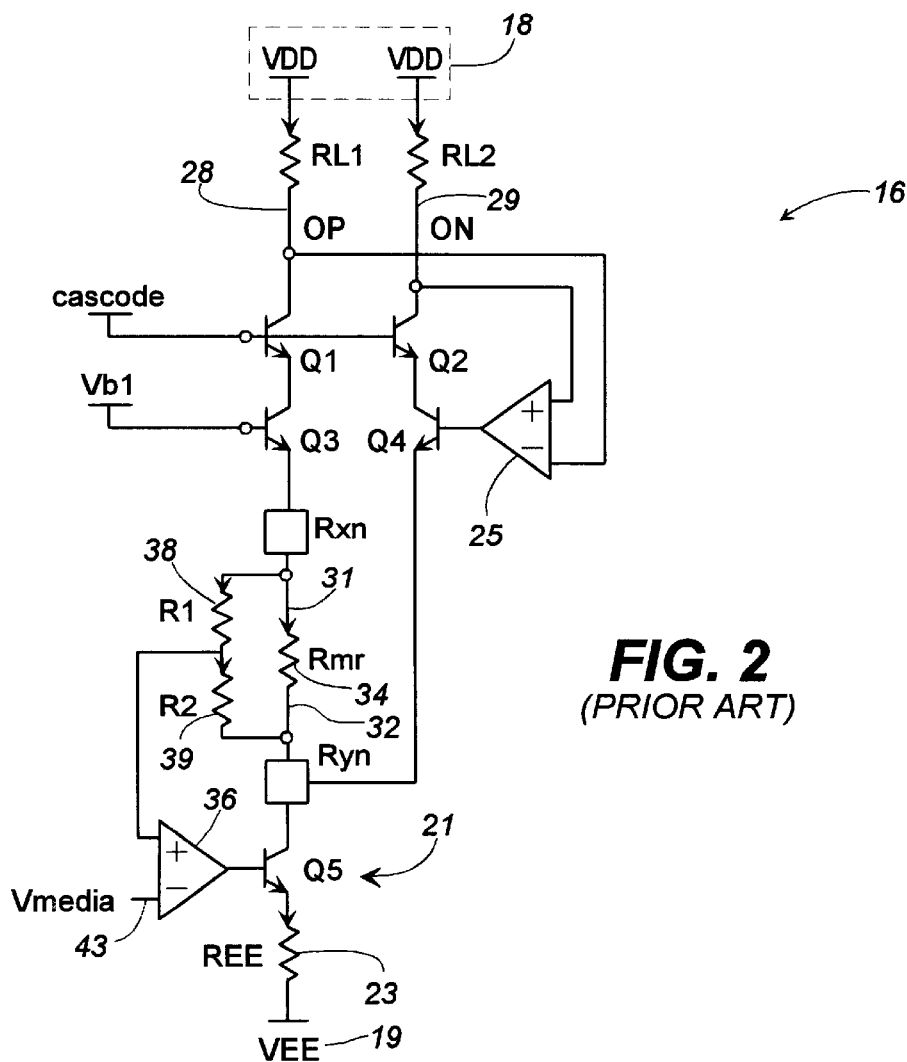
FIG. 2 illustrates a dual-supply MR head read amplifier of the type commonly used in magnetic read/write systems such as that shown in FIG. 1.

FIG. 2 illustrates a dual-supply MR head read amplifier 16 of the type commonly used in magnetic read/write systems such as that shown in FIG. 1. One advantageous feature of the head read amplifier 16 is that the dual-supply, indicated by the positive supply, VDD 18, and by the negative supply, VEE 19, allows a 0 volt head-to-media bias to be used, i.e., the media is biased at ground, which is a convenient mechanical design feature of the head read amplifier 16. Another advantageous feature of the head read amplifier 16 is that the design of the bottom current sink, which consists of transistor 21 and emitter resistor 23, reduces the noise of the bottom current sink.

The feedback amplifier 25 forces the currents in the two legs of the circuit 28 and 29 to be identical. The head read amplifier 16 has a relatively low and balanced input impedance that results in a very high common mode rejection ratio (CMRR) for rejecting noise capacitively coupled into the long leads 31 and 32 of the Rmr element 34. The leads 31 and 32 are long because the head read amplifier 16 is physically separate from the read head 4 and the leads 31 and 32 must be long enough to connect the Rmr element 34 to the head read amplifier 16. A feedback loop formed by connecting the non-inverting terminal of amplifier 36 to the node between resistors 38 and 39 controls the current source transistor 21 to ensure a low head-to-media bias in which the media voltage, Vmedia 43, is forced by the feedback loop to be the same as the voltage at the midpoint of the MR element 34.

Typically, the negative supply VEE 19 ranges from −3 volts to −5 volts dc. This large negative voltage is necessary to decrease the noise in the bottom current sink, which usually is the dominant noise source in the head read amplifier 16. If the emitter degeneration resistor 23 is sufficiently large, the noise current, In, of the bottom current source is defined as:

$$In^2 = \frac{2qIc}{\beta} + \frac{4KbT}{R_{EE}}$$

where Ic is the collector current, b is the current gain, q is the electron charge, Kb is Boltzman's constant and T is absolute temperature. In the absence of the emitter degeneration resistor 23 with a large voltage drop across it, the noise current, In, would be the total shot noise of the collector current defined as:

$$In^2 = 2qIc$$

which would result in unacceptable noise.

Although degeneration resulting from the use of the degeneration resistor 23 reduces noise in the bottom current sink, the bottom current source transistor 21 is still likely to be a large noise contributor. In accordance with the present invention, a head read amplifier is provided which reduces the noise in the output current and in the bottom current sink by utilizing an inductor which serves the same function as the degeneration resistor 23, but which does not require a large voltage drop in the current sink. Furthermore, the head read amplifier of the present invention is much more effective than the head read amplifier shown in FIG. 2 at high frequencies, as discussed in more detail below with respect to FIG. 3. The present invention also obviates the need for a negative voltage supply while, at the same time, converting the largest noise contributor, namely, the bottom current source transistor, into a relatively insignificant noise contributor.

In order to reduce noise in the output current of a head read amplifier, In, the head read amplifier should be designed in such a manner that a high CMRR is maintained. Prior approaches have attempted to achieve a high CMRR by maintaining a low head-to-media bias while, at the same time, using a large voltage drop across the bottom current source transistor to effectively decrease the transconductance of the bottom current source transistor. The single-polarity head read amplifier 50 of the present invention maintains a low head-to-media bias while, at the same time, producing a very low voltage drop across the bottom current sink. Prior to describing the advantages of the single-polarity head read amplifier 50 of the present invention, a discussion of the overall operation of the head read amplifier 50 will be provided.

Figure 3:
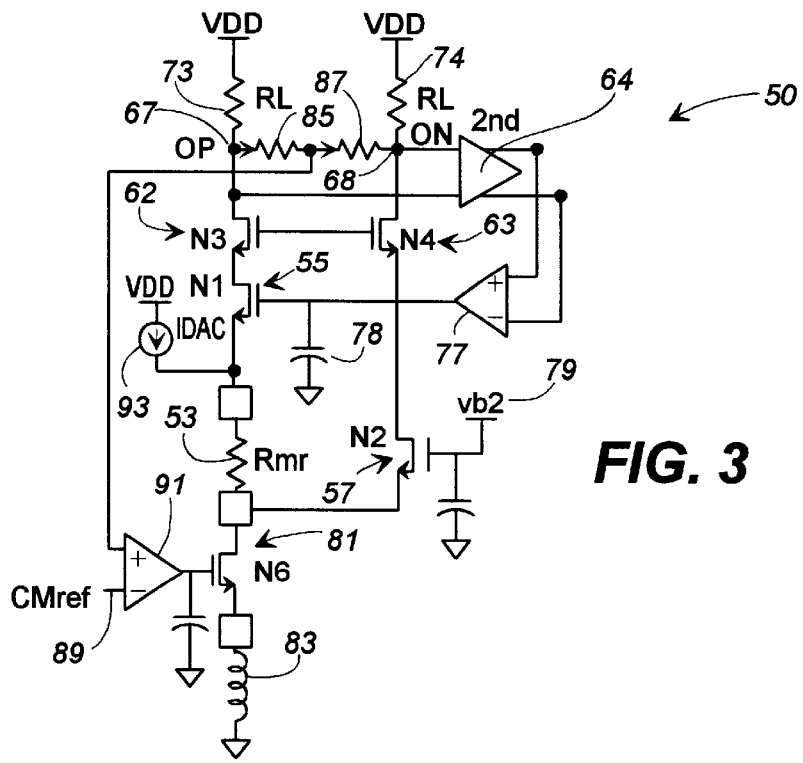
FIG. 3 is a schematic block diagram of the single-polarity MR head read amplifier of the present invention in accordance with a first embodiment.

FIG. 3 is a schematic block diagram of the single-polarity head read amplifier 50 of the present invention in accordance with a first embodiment. When reading information stored on a storage media (not shown), ambient magnetic fields around the MR element 53, also denoted by "Rmr", cause a change in resistance, ΔR, of MR element 53. This change in resistance results in a change in current through MR element 53, due to the fact that the steady-state voltage biasing of the common-gate field effect transistors (FETs) 55 and 57 is constant. These fluctuations of the current in Rmr 53 result in equal and opposite phase currents in transistors 55 and 57. This is due to the fact that the impedances looking into the sources of transistors 55 and 57 are equal and have a value of 1/gm of each of the transistors 55 and 57, where gm is transconductance.

Two transistors 62 and 63, which preferably are cascode (i.e., common gate) FETs, are utitlized to increase voltage gain and decrease Miller affect, as will be understood by those skilled in the art. The differential currents resulting from the change in the resistance of MR element 53, ΔR, are converted to a differential output voltage across nodes 67 and 68. Two feedback loops set the operating point, namely, (1) a common mode loop that forces the sum of currents in both resistors 73 and 74 to be 2·ImrMin, and (2) a differential feedback loop that nulls the differential output voltage from the first, second or any DC-coupled gain stage in the amplification chain. The second gain stage, denoted by numeral 64 in FIG. 3, provides additional gain that may be needed by the user and may comprise, for example, a differential pair with resistor loads, as will be understood by those skilled in the art.

In the differential feedback loop, amplifier 64 amplifies the difference between the voltages at terminals 67 and 68 to create OP2-ON2 at the input of amplifier 77. Amplifier 77 converts this voltage into a current signal that is then integrated by the capacitor 78 to provide the right amount of gate bias to turn on transistor 55. Transistor 55 is driven in this negative feedback loop by just the right amount so that the average difference voltage at terminals 67 and 68 is small. The differential output voltage across terminals 67 and 68 is nulled by error amplifier 64. The gate of transistor 57 is connected to a fixed bias voltage, Vb2 79, which may be, for example, a diode-connected FET fed by a reference current from VDD and having its source connected to ground and its gate and drain shorted. Although only the gate of transistor 55 is shown as being connected to and driven by error amplifier 77, either the gate of transistor 55 or the gate of transistor 57 may be connected to and driven by the error amplifier 77 in order to generate the proper polarity in the differential feedback loop needed to null the differential output voltage.

The common mode feedback loop sets the minimum value of the MR bias current (Imr), hereinafter referred to as ImrMin. The common-mode feedback loop is comprised of transistor 81, the inductor 83, both sides of the common-gate cascode configuration, and the common mode sensing resistors 85 and 87 located between nodes 67 and 68. The common mode reference voltage 89, Cmref, is set at a voltage below VDD such that when VDD-($V_{node\ 67}$+$V_{node\ 68}$)/2=VDD-Cmref, the common mode feedback loop is settled. $V_{node\ 67}$ represents the voltage at node 67 and $V_{node\ 68}$ represents the voltage at node 68. The amplifier 91 controls the gate of current source transistor 81 so that the sum of currents through both resistors 73 and 74 is 2ImrMin.

Additional MR bias current is injected with the current digital-to analog converter 93, IDAC, the value of which preferably is I(IDAC)=Imr−ImrMin. In accordance with the preferred embodiment of the present invention, the IDAC 93 is programmable to allow the MR head bias to be optimized for maximum signal output and long-term reliability. Higher values of Imr may be desirable for producing high signal output while lower values of Imr may be desirable for long-term head reliability. Low values of Imr are often desirable because changes in the resistance of the magneto resistor 53 are approximately linearly proportional to Imr, which means that the read head can melt due to power dissipated in the magneto resistor 53. The bias voltage, vb2 79, is fixed to maintain a low head-to-media bias so that, when transistor 81 is saturated, the voltage across the bottom current drain is only approximately 0.4 volts. The noise from the current source transistor 81 is heavily rolled off at higher frequency due to the impedance of the inductor 83.

It should be noted that other feedback loops can also be designed and implemented to set the operating point of the MR head read amplifier 50 of the present invention, as will be understood by those skilled in the art. The preferred designs for the common mode and differential feedback loops are discussed for purposes of demonstrating the principles of the present invention. It will be understood by those skilled in the art that other designs for the common mode feedback loop can be implemented to set the minimum value of the MR bias current (Imr), ImrMin, which fixes the DC voltage at the bottom of resistors 73 and 74 at terminals 67 and 68 to some desired DC level. Similarly, other designs can be implemented for the differential feedback loop in order to null the differential output voltage at terminals 67 and 68 while providing the appropriate amount of gain to turn on transistor 55.

Another advantage of the head read amplifier 50 of the present invention is that only a fraction of the current noise resulting from the active IDAC 93, as well as from the bottom current sink, appears as a differential component at the output of the head read amplifier 50 across nodes 67 and 68. Common mode noise components are rejected by the CMRR of the second stage 64. Since the impedance looking into the transistor 57 is high, all of the noise current from the IDAC 93 and sink is forced to go into the low impedance of transistors 57 and 62.

Figure 4:
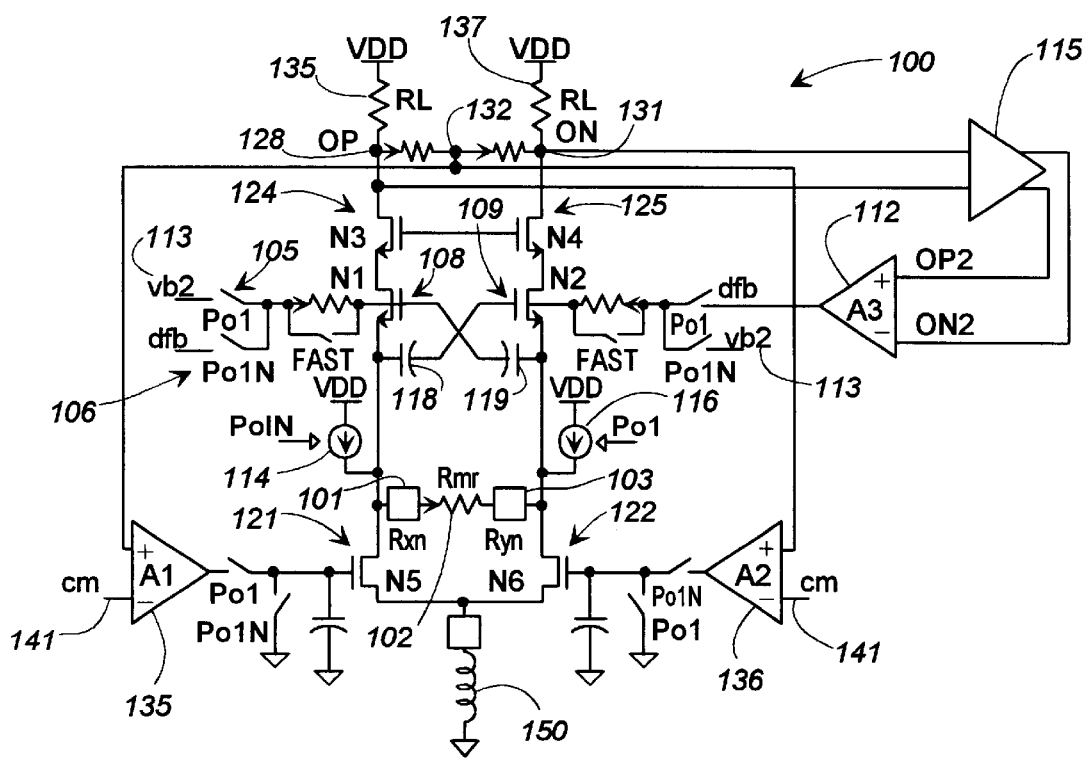
FIG. 4 illustrates the dual-polarity, bidirectional MR head read amplifier of the present invention in accordance with the second embodiment which is capable of generating a bidirectional MR bias current.

The components of the single-polarity head read amplifier 50 shown in FIG. 3 may be duplicated and combined to obtain a dual-polarity MR head read amplifier. FIG. 4 illustrates the dual-polarity, bi-directional MR head read amplifier of the present invention in accordance with the second embodiment which is capable of generating a bidirectional MR bias current. Generally, the bidirectional MR head read amplifier 100 shown in FIG. 4 comprises two of the single-polarity head read amplifier circuits 50 shown in FIG. 3, which have been combined to obtain the dual-polarity MR head read amplifier shown in FIG. 4. The overall operation of the dual-polarity head read amplifier 100 is very similar to the operation of the single-polarity head read amplifier 50 discussed above with respect to FIG. 3. When reading information stored on a storage media (not shown), ambient magnetic fields around the MR element 102, also denoted by "Rmr", cause a change in resistance, ΔR, of MR element 102. This change in resistance results in a change in current through MR element 102.

During operation, when the polarity control signal Pol 105 is true, Imr flows in the direction from Rxn 101 to Ryn 103. Control signal PolN 106 is the complement of Pol. The terms "Rxn" 101 and "Ryn" 103 are used to denote the read input pins connected to the leads of the nth read head when the head read amplifier 100 is incorporated into a multi-head system (i.e., Rx1 and Ry1 are connected to the terminals of the 1st read head, etc.). It will be apparent to those skilled in the art that the head read amplifier 100 may be implemented in a single-head system or in a multi-head system.

When Pol is false, Imr flows in the direction from Ryn 103 to Rxn 101. Depending upon the state of Pol, transistors 108 and 109 are driven by the differential loop error amplifier 112 or by the fixed reference voltage vb2 113, as shown by the switch configuration in the FIG. 4. Preferably, the logic that drives Pol and PolN is a register (not shown) that may be controlled by a microcontroller, by a microprocessor or by some other logic, as will be understood by those skilled in the art. The user may program this register to select the desired MR bias current polarity. Two IDACs 114 and 116 preferably are implemented in head read amplifier 100, only one of which is in the "on" position at any particular time, as controlled by the assertion of control signal Pol.

Transistors 124 and 125, which preferably are cascode FETs, increase voltage gain and decrease Miller affect. The differential currents resulting from the change in the resistance of MR element 102, ΔR, are converted to a differential output voltage across nodes 128 and 131. The common mode loop formed by feeding back the voltage at nodes 132 into amplifiers 135 and 136 forces the sum of currents in both resistors 135 and 137 to be 2·ImrMin. The differential feedback loop formed by feeding back the differential output voltage across nodes 128 and 131 into differential error amplifier 112 nulls the differential output voltage across nodes 128 and 131. When POl is true, the differential error amplifier 112 drives the gate of transistor 109 while the gate of transistor 108 is driven by the fixed bias voltage, Vb2 113. When POl is false, the gate of transistor 109 is connected to the fixed bias voltage 113 and the gate of transistor 108 is controlled by the error amplifier 112.

The common mode reference voltage 141 is set at a voltage below VDD such that when VDD−($V_{node\ 128}$+$V_{node\ 131}$)/2=VDD−Cmref, the common mode feedback loop is settled. $V_{node\ 128}$ represents the voltage at node 128 and $V_{node\ 131}$ represents the voltage at node 131. Cmref is the reference voltage 141 applied to amplifiers 135 and 136. The amplifiers 135 and 136 controls the gates of transistors 121 and 122 so that the sum of currents through both resistors 135 and 137 is 2ImrMin. Capacitors 108 and 109 create an AC short to ground at the gates of 121 and 122, which prevents any noise in the common mode feedback loop from being transmitted to the gate of transistors 121 and 122. The gates of transistors 121 and 122 should only see a dc bias and no unwanted signals because any unwanted signals will be amplified.

Additional MR bias current, Imr, is injected with the IDAC 114 and 116. In accordance with the preferred embodiment of the present invention, the IDACs 114 and 116 are programmable to allow the MR head bias to be optimized for maximum signal output and long-term reliability. Higher values of Imr may be utilized for high signal output while lower values of Inr are desirable for long-term head reliability. The bias voltage, vb2 113, is fixed to maintain a low head-to-media bias so that, when either of transistors 121 or 122 is saturated, the voltage across the bottom current drain is only approximately 0.4 volts. The noise from the current source transistors 121 and 122 is heavily rolled off at higher frequency due to the impedance of the inductor 150.

Only a fraction of the current noise resulting from the active IDACs 114 and 116, as well as from the bottom current sink, appears as a differential component at the output of the head read amplifier 100 across nodes 128 and 131. Common mode noise components are rejected by the CMRR of the second stage, which is represented by amplifier 115. Since the impedances looking into the transistors 108 and 109 are high, all of the noise current from the IDACs 114 and 116 and from the sink is forced to go into the low impedances of tansistors 124 and 122, or into the low impedances of transistors 125 and 121, depending on the state of POl. Cross coupled capacitors 118 and 119 increase the CMRR of the input stages comprised by amplifiers 135 and 136.

The manner in which noise is reduced by utilizing the head read amplifier 100 can be demonstrated by considering the input noise voltage, $e_n$, of the transistors 121 and 122. The equations set forth in Table 1, below, will be utilized for this purpose.

TABLE 1

$$e_n = \sqrt{\frac{4Kbt\gamma}{gm}} \qquad VdSat = \sqrt{\frac{2Id}{\left(\frac{W}{L}\right)\mu Cox}}$$

$$gm = 2\frac{Id}{vdsat} \qquad fp\ sink := \frac{Vdsat_{sink}}{2\pi L2I_{sink}}$$

The output noise, in terms of VdSat, the pole frequency of the current sink, and drain current may be obtained by using the expressions in Table 1 in the manner shown below to determine the output noise:

$$InSink := \sqrt{4KbT\gamma\left(2\frac{I_{sink}}{Vdsat_{sink}}\right)} \cdot \frac{2\frac{I_{sink}}{Vdsat_{sink}}}{\sqrt{1+\left(\frac{f}{fp_{sink}}\right)}}$$

where Vdsat is the lowest drain-to-source voltage possible while keeping the device in saturation and fp is the pole frequency that the effective transconductance, gm, of the bottom current source (transistors 121 or 122) sees, i.e., the gm of the bottom current source starts rolling off at that frequency at 6db/octave. This equation demonstrates that the sink noise is rolled off as a function of frequency, f, so that at higher frequencies within the passband of the head read amplifier 100, the noise of the current sink of the head read amplifier 100 is negligible.

It should be noted that the advantages of the single-polarity head read amplifier 50 of FIG. 3, i.e., reduction of noise attributable to the IDACs and to the bottom current sink, also apply to the dual-polarity head read amplifier 100 of FIG. 4. Those skilled in the art will understand the manner in which these advantages are achieved by the head read amplifier 100 in view of the above discussion. Thus, the dual-polarity head read amplifier 100 of the present invention is capable of selectively biasing an MR read head with opposite polarities while also minimizing noise in the MR head read amplifier 100.

It should be noted that the present invention has been described with reference to the preferred embodiments and that the present invention is not limited to these embodiments. Those skilled in the art will understand that modifications may be made to the embodiments discussed above without deviating from the spirit and scope of the present invention.

What is claimed is:

1. A head read amplifier circuit of a magnetic read/write system, the head read amplifier circuit comprising:
   a magneto resistor having a first terminal and a second terminal, the magneto resistor sensing changes in magnetic flux on a surface of a magnetic storage medium and producing changes in the resistance of the magneto resistor in response to the changes in magnetic flux;
   a bias-current source for generating a bias current for the magneto resistor, the bias-current source having an output terminal coupled to the first terminal of the magneto resistor for passing the bias current through the magneto resistor;
   a differential feedback circuit coupled to first and second output terminals of the head read amplifier circuit, the differential feedback circuit receiving a differential output voltage generated at the output terminals of the head read amplifier circuit and nulling the differential output voltage, the output of the differential feedback circuit being coupled to the first terminal of the magneto resistor;
   a common mode feedback circuit, the common mode feedback circuit setting a minimum bias current for the magneto resistor, the common mode feedback circuit being coupled to the second terminal of the magneto resistor via a current-source transistor, the common mode feedback circuit comprising a first cascode circuit and a second cascode circuit, the first and second cascode circuits each comprising a plurality of transistors connected in series, the first cascode circuit having a first terminal coupled to the first output terminal of the head read amplifier circuit and a second terminal coupled to the first terminal of the magneto resistor, the second cascode circuit having a first terminal coupled to the second output terminal of the head read amplifier circuit and a second terminal coupled to the second terminal of the magneto resistor; and
   a current drain comprising the current-source transistor and an inductor, the current-source transistor having a first terminal, the common mode feedback circuit being coupled to the first terminal of the current-source transistor, the current-source transistor having a second terminal coupled to the second terminal of the magneto resistor, the current-source transistor having a third terminal coupled to a first terminal of the inductor, the inductor having a second terminal coupled to ground, wherein the impedance of the inductor reduces any noise generated by the current-source transistor.

2. The head read amplifier circuit of claim 1, wherein the bias-current source is a current-digital-to-analog converter, and wherein the value of the bias current can be adjusted by adjusting the current-analog-to-digital converter.

3. The head read amplifier circuit of claim 1, wherein the differential feedback circuit comprises a gain stage that amplifies the differential output voltage, a voltage-to-current converter stage that converts the amplified differential output voltage into a current signal, and a capacitor that integrates the current signal, wherein the capacitor is coupled to the first cascode circuit for turning on the first cascode circuit.

4. The head read amplifier circuit of claim 3, wherein the common mode feedback circuit comprises a common mode amplifier, the common mode amplifier having a first terminal coupled between the output terminals of the head read amplifier circuit via a sensing resistor and a second terminal coupled to a common mode reference voltage, the common mode amplifier having an output terminal coupled to the first terminal of the current-source transistor, the first terminal of the current-source transistor being the gate of the current-source transistor.

5. A dual-polarity head read amplifier capable biasing a magneto resistor of the head read amplifier with a current having a first polarity or a second polarity, the first and second polarities being opposite to one another, the head read amplifier comprising:
   said magneto resistor, said magneto resistor having a first terminal and a second terminal, the magneto resistor sensing changes in magnetic flux on a surface of a magnetic storage medium and producing changes in the resistance of the magneto resistor in response to the changes in magnetic flux;
   a first bias-current source for generating a first bias current for the magneto resistor, the first bias-current source having said first polarity, the first bias-current source having an output terminal coupled to the first terminal of the magneto resistor via switching logic for passing the first bias current through the magneto resistor when said switching logic is in a first state; and a second bias-current source for generating a second bias current for the magneto resistor, the second bias-current source having said second polarity, the second bias-current source having an output terminal coupled to the second terminal of the magneto resistor via the switching logic for passing the second bias current through the magneto resistor when said switching logic is in a second state; and a current drain comprising first and second current-source transistors and an inductor;

a first transistor circuit having a first terminal coupled to a first output terminal of the head read amplifier circuit, a second terminal coupled to the first terminal of the magneto resistor, and a third terminal coupled to the switching logic; and a second transistor circuit having a first terminal coupled to a second output terminal of the head read amplifier circuit, a second terminal coupled to the second terminal of the magneto resistor, and a third terminal coupled to the switching logic, wherein when the switching logic is in the first stat(, the third terminal of the first transistor circuit is coupled to and biased by a fixed reference voltage source and the third terminal of the second transistor circuit is coupled to and biased by an output of a differential error amplifier, wherein when the switching logic is in the second state, the third terminal of the second transistor circuit is coupled to and biased by the fixed reference voltage source and the third terminal of the first transistor circuit is coupled to and biased by the output of the differential error amplifier.

6. The dual-polarity head read amplifier of claim 5 further comprising:

a differential feedback circuit coupled to first and second output terminals of the head read amplifier circuit, the differential feedback circuit receiving a differential output voltage generated at the output terminals of the head read amplifier circuit and nulling the differential output voltage, the differential error amplifier being comprised by the differential feedback circuit, the output of the differential feedback circuit being generated at the output of the differential error amplifier, the differential feedback circuit being coupled to the switching logic via the differential error amplifier.

7. The dual-polarity head read amplifier circuit of claim 6 further comprising:

a first common mode feedback circuit coupled to the output terminals of the head read amplifier circuit, the first common mode feedback circuit setting a minimum value for the first bias current, the first common mode feedback circuit being coupled to the first terminal of the magneto resistor via a first current-source transistor;

a second common mode feedback circuit coupled to the output terminals of the head read amplifier circuit, the second common mode feedback circuit setting a minimum value for the second bias current, the second common mode feedback circuit being coupled to the second terminal of the magneto resistor via a second current-source transistor; and a current drain comprising the first and second current-source transistors and an inductor, the first current-source transistor having a first terminal, the first common mode feedback circuit being coupled to the first terminal of the first current-source transistor via the switching logic, the first current-source transistor having a second terminal coupled to the first terminal of the magneto resistor, the first current-source transistor having a third terminal coupled to a first terminal of the inductor, the second current-source transistor having a first terminal, the second common mode feedback circuit being coupled to the first terminal of the second current-source transistor via the switching logic, the second current-source transistor having a second terminal coupled to the second terminal of the magneto resistor, the second current-source transistor having a third terminal coupled to a first terminal of the inductor, the inductor having a second terminal coupled to ground, wherein the impedance of the inductor reduces any noise generated by the first and second current-source transistors.

8. The dual-polarity head read amplifier circuit of claim 7, wherein the first bias-current source is a first current-digital-to-analog converter, and wherein the value of the first bias current can be adjusted by adjusting the first current-analog-to-digital converter.

9. The dual-polarity head read amplifier circuit of claim 8, wherein the second bias-current source is a second current-digital-to-analog converter, and wherein the value of the second bias current can be adjusted by adjusting the second current-analog-to-digital converter.

10. The dual-polarity head read amplifier circuit of claim 9, wherein the first transistor circuit corresponds to a first cascode circuit and wherein the second transistor circuit corresponds to a second cascode circuit, the first and second cascode circuits each comprising a plurality of transistors connected in series, the first cascode circuit having a first terminal coupled to the first output terminal of the head read amplifier circuit, the first cascode circuit having a second terminal coupled to the first terminal of the magneto resistor, the second cascode circuit having a first terminal coupled to the second output terminal of the head read amplifier circuit, the second cascode circuit having a second terminal coupled to the second terminal of the magneto resistor, the first cascode circuit being cross-coupled to the second cascode circuit via a pair of capacitors.

11. The dual-polarity head read amplifier circuit of claim 10, wherein the differential feedback circuit comprises a gain stage that amplifies the differential output voltage, a voltage-to-current converter stage that converts the amplified differential output voltage into a current signal, and said pair of capacitors for integrating the current signal.

12. The dual-polarity head read amplifier circuit of claim 11, wherein the first common mode feedback circuit comprises a first common mode amplifier, the first common mode amplifier having a first terminal coupled between the output terminals of the head read amplifier circuit via a sensing resistor and a second terminal coupled to a common mode reference voltage, the first common mode amplifier having an output terminal coupled to the first terminal of the first current-source transistor via the switching logic, the first terminal of the first current-source transistor being the gate of the first current-source transistor, wherein when the switching logic is in the first state, the switching logic connects the output of the first common mode amplifier to the gate of the first current-source transistor whereby the first current-source transistor is turned on.

13. The dual-polarity head read amplifier circuit of claim 12, wherein the second common mode feedback circuit comprises a second common mode amplifier, the second common mode amplifier having a first terminal coupled between the output terminals of the head read amplifier circuit via the sensing resistor and a second terminal coupled to the common mode reference voltage, the second common mode amplifier having an output terminal coupled to the first terminal of the second current-source transistor via the switching logic, the first terminal of the second current-source transistor being the gate of the second current-source transistor, wherein when the switching logic is in the second state, the switching logic connects the output of the second common mode amplifier to the gate of the second current-source transistor whereby the second current-source transistor is turned on, wherein when the second current-source transistor is turned on, the first current-source transistor is turned off, and wherein when the first current-source transistor is turned on, the second current-source transistor is turned off.

14. A dual-polarity head read amplifier circuit capable biasing a magneto resistor of the head read amplifier circuit with a current having a first polarity or a second polarity, the first and second polarities being opposite to one another, the head read amplifier circuit comprising:

said magneto resistor, said magneto resistor having a first terminal and a second terminal, the magneto resistor sensing changes in magnetic flux on a surface of a magnetic storage medium and producing changes in the resistance of the magneto resistor in response to the changes in magnetic flux;

a first bias-current source for generating a first bias current for the magneto resistor, the first bias-current source having said first polarity, the first bias-current source having an output terminal coupled to the first terminal of the magneto resistor via switching logic for passing the first bias current through the magneto resistor when said switching logic is in a first state;

a second bias-current source for generating a second bias current for the magneto resistor, the second bias-current source having said second polarity, the second bias-current source having an output terminal coupled to the second terminal of the magneto resistor via the switching logic for passing the second bias current through the magneto resistor when said switching logic is in a second state;

a first transistor circuit having a fist terminal coupled to a first output terminal of the head read amplifier circuit, a second terminal coupled to the first terminal of the magneto resistor, and a third terminal coupled to the switching logic; and a second transistor circuit having a first terminal coupled to a second output terminal of the head read amplifier circuit, a second terminal coupled to the second terminal of the magneto resistor, and a third terminal coupled to the switching logic, wherein when the switching logic is in the first state, the third terminal of the first transistor circuit is coupled to and biased by a fixed reference voltage source and the third terminal of the second transistor circuit is coupled to and biased by an output of a differential error amplifier, wherein when the switching logic is in the second state, the third terminal of the second transistor circuit is coupled to and biased by the fixed reference voltage source and the third terminal of the first transistor circuit is coupled to and biased by the output of the differential error amplifier.

15. The dual-polarity head read amplifier circuit of claim 14 further comprising:

a differential feedback circuit coupled to first and second output terminals of the head read amplifier circuit, the differential feedback circuit receiving a differential output voltage generated at the output terminals of the head read amplifier circuit and nulling the differential output voltage, the differential error amplifier being comprised by the differential feedback circuit, the output of the differential feedback circuit being generated at the output of the differential error amplifier, the differential feedback circuit being coupled to the switching logic via the differential error amplifier.

16. The dual-polarity head read amplifier circuit of claim 15 further comprising:

a first common mode feedback circuit coupled to the output terminals of the head read amplifier circuit, the first common mode feedback circuit setting a minimum value for the first bias current, the first common mode feedback circuit being coupled to the first terminal of the magneto resistor via a first current-source transistor;

a second common mode feedback circuit coupled to the output terminals of the head read amplifier circuit, the second common mode feedback circuit setting a minimum value for the second bias current, the second common mode feedback circuit being coupled to the second terminal of the magneto resistor via a second current-source transistor; and a current drain comprising the first and second current-source transistors and an inductor, the first current-source transistor having a first terminal, the first common mode feedback circuit being coupled to the first terminal of the first current-source transistor via the switching logic, the first current-source transistor having a second terminal coupled to the first terminal of the magneto resistor, the first current-source transistor having a third terminal coupled to a first terminal of the inductor, the second current-source transistor having a first terminal, the second common mode feedback circuit being coupled to the first terminal of the second current-source transistor via the switching logic, the second current-source transistor having a second terminal coupled to the second terminal of the magneto resistor, the second current-source transistor having a third terminal coupled to a first terminal of the inductor, the inductor having a second terminal coupled to ground, wherein the impedance of the inductor reduces any noise generated by the first and second current-source transistors.

17. The dual-polarity head read amplifier circuit of claim 16, wherein the first bias-current source is a first current-digital-to-analog converter, and wherein the value of the first bias current can be adjusted by adjusting the first current-analog-to-digital converter.

18. The dual-polarity head read amplifier circuit of claim 17, wherein the second bias-current source is a second current-digital-to-analog converter, and wherein the value of the second bias current can be adjusted by adjusting the second current-analog-to-digital converter.

19. The dual-polarity head read amplifier circuit of claim 18, wherein the first transistor circuit corresponds to a first cascode circuit and wherein the second transistor circuit corresponds to a second cascode circuit, the first and second cascode circuits each comprising a plurality of transistors connected in series, the first cascode circuit having a first terminal coupled to the first output terminal of the head read amplifier circuit, the first cascode circuit having a second terminal coupled to the first terminal of the magneto resistor, the second cascode circuit having a first terminal coupled to the second output terminal of the head read amplifier circuit, the second cascode circuit having a second terminal coupled to the second terminal of the magneto resistor, the first cascode circuit being cross-coupled to the second cascode circuit via a pair of capacitors.

20. The dual-polarity head read amplifier circuit of claims 19, wherein the differential feedback circuit comprises a gain stage that amplifies the differential output voltage, a voltage-to-current converter stage that converts the amplified differential output voltage into a current signal, and said pair of capacitors for integrating the current signal.

21. The dual-polarity head read amplifier circuit of claim 20, wherein the first common mode feedback circuit comprises a first common mode amplifier, the first common mode amplifier having a first terminal coupled between the output terminals of the head read amplifier circuit via a sensing resistor and a second terminal coupled to a common mode reference voltage, the first common mode amplifier having an output terminal coupled to the first terminal of the first current-source transistor via the switching logic, the first terminal of the first current-source transistor being the gate of the first current-source transistor, wherein when the switching logic is in the first state, the switching logic connects the output of the first common mode amplifier to the gate of the first current-source transistor whereby the first current-source transistor is turned on.

22. The dual-polarity head read amplifier circuit of claim 21, terminal, wherein the second common mode feedback circuit comprises a second common mode amplifier, the second common mode amplifier having a first terminal coupled between the output terminals of the head read amplifier circuit via the sensing resistor and a second terminal coupled to the common mode reference voltage, the second common mode amplifier having an output terminal coupled to the first terminal of the second current-source transistor via the switching logic, the first terminal of the second current-source transistor being the gate of the second current-source transistor, wherein when the switching logic is in the second state, the switching logic connects the output of the second common mode amplifier to the gate of the second current-source transistor terminal whereby the second current-source transistor is turned on, wherein when the second current-source transistor is turned on, the first current-source transistor is turned off, and wherein when the first current-source transistor is turned on, the second current-source transistor is turned off.

* * * * *